United States Patent [19]

Hsia

[11] 4,188,670
[45] Feb. 12, 1980

[54] ASSOCIATIVE INTERCONNECTION CIRCUIT

[75] Inventor: Yukun Hsia, Santa Ana, Calif.

[73] Assignee: McDonnell Douglas Corporation, Long Beach, Calif.

[21] Appl. No.: 868,667

[22] Filed: Jan. 11, 1978

[51] Int. Cl.² .......................................... G11C 11/40
[52] U.S. Cl. .................................... 365/49; 307/238
[58] Field of Search ............... 365/49, 200; 307/238

[56] References Cited

U.S. PATENT DOCUMENTS

| | | | |
|---|---|---|---|
| 3,331,058 | 7/1967 | Perkins | 365/200 |
| 3,432,812 | 3/1969 | Elfant | 365/200 |
| 3,434,116 | 3/1969 | Anacker | 365/200 |
| 3,644,906 | 2/1972 | Weinberger | 365/200 |
| 3,781,826 | 12/1973 | Beausoleil | 365/200 |
| 3,803,562 | 4/1974 | Hunter | 365/200 |
| 3,813,650 | 5/1974 | Hunter | 365/200 |
| 3,882,470 | 5/1975 | Hunter | 365/200 |
| 4,047,163 | 9/1977 | Choate et al. | 365/200 |

Primary Examiner—Terrell W. Fears
Attorney, Agent, or Firm—Henry G. Kohlmann; Walter J. Jason; Donald L. Royer

[57] ABSTRACT

The disclosed apparatus uses an associative memory technique for the selective coupling of circuit elements to a data bus wherein each element is assigned an associative address and is coupled to the data bus when it receives said address on its address lines. The apparatus further comprises a reconfiguration control unit for assigning associative addresses to all elements, allowing said elements to be addressed at random. When one function element is to be substituted for another, the reconfiguration control unit assigns the address of the replaced element to the replacing element. In this way, the user continues to use the same address, making an element replacement transparent to the user, thereby avoiding reprogramming by the user. In the preferred embodiment the associative address is stored in nonvolatile memory so that it will not be lost when power is turned off, but is electrically reprogrammable if necessary or desired. Power to each element may also be supplied through a bus line so that when the element is not addressed or is uncoupled, the power is disconnected, reducing the drive current required to operate an array of circuit elements. This technique is especially useful for wafer scale integration where a plurality of functional elements are contained on one wafer. The control unit can test the elements, designate some of the operable elements for use and designate the remaining operable elements as spares. Upon the failure of an element which is being used, the control unit can assign an unused address to the original element and the original address to the replacement element. Thus, the capability of random sparing of function elements can be accomplished on a single wafer in a way that is transparent to the user.

10 Claims, 6 Drawing Figures

ASSOCIATIVE INTERCONNECTION CIRCUIT

BACKGROUND OF THE INVENTION

The present invention relates to an improved method and apparatus for interconnecting large scale integrated (LSI) circuits and, more particularly, associative techniques for interconnecting LSI elements on a wafer to enable wafer scale integration.

Present methods of semiconductor fabrication typically require that a plurality of identical semiconductor elements or circuits be fabricated on a single wafer substrate by a series of process steps. At the conclusion of this fabrication process, the elements or circuits are tested and the defective elements identified. The wafer is then scored and diced into individual parts, each containing a complete circuit. Finally, the operable parts are packaged to provide external electrical connections and appropriate environmental protection.

It has long been realized that circuit costs as well as space and power requirements could be reduced if the operable parts or elements on the wafer could be interconnected on the wafer itself. This would reduce the necessity for circuit boards and interconnection wiring between elements, which would, in turn, result in a decrease in space and cost.

A variety of methods for interconnecting elements on a wafer have been suggested. One method is to add another metalization step after the circuits or elements of the wafer are tested to interconnect the operable element on the wafer. The difficulty with this method is that a different mask is required for each individual wafer, greatly increasing the cost of the finished product.

Another method is the inverse of the discretionary wiring concept attempted in the 1960's to achieve LSI circuits with small scale integrated and medium scale integrated circuits. Usually, the arrays to be connected are storage arrays. Each array consists of a storage portion, an address mechanism for accessing the data and a permanent disconnection mechanism. The permanent disconnection mechanism is accomplished by blowing a fuse, or charging up a floating gate MOS (FAMOS) device, or laser burnout, etc. The disconnection isolates a defective array from the wafer bus so that the defective arrays do not interact adversely with the operative arrays. Although this method is suitable for wafer scale integration, it is limited in application. It requires a hardwired decoder and does not permit reconnection of the spring of arrays for increased reliability.

Another wafer integration scheme, as described in U.S. Pat. No. 3,940,740, provides for spare rows and columns on the wafer matrix for appropriate sparing in case of defective elements. One disadvantage of this configuration is that an entire row of elements must be provided, in the worst case, to spare a single defective matrix element. A preferred method would be one where spare elements can be inserted into the matrix on a random basis to allow all spare elements to be used.

In addition, all of these methods require extensive decoding circuits and uniquely dedicated decoding bus lines for element enable, which reduce the usable area of the wafer and add possible failure sites. Because of these reasons, wafer scale integration is seldom achieved.

What is required is a wafer scale integration configuration wherein a relatively small number of spare elements and a relatively simple decoding circuit are employed to obtain high reliability and high functional circuit density at the wafer level.

It is also an object of this invention to allow the replacing circuit element to assume the address of the replaced element so that the system need not be reprogrammed after the replacement.

SUMMARY OF THE INVENTION

The inventive circuit uses an associative interconnection technique to provide for the interconnection of elements on a wafer. The function of each element to be connected is not material; the elements on the wafer may be charge-coupled devices, shift registers, memory elements, arithmetic logic, etc. Furthermore, the elements need not all be the same. That is, the elements on the wafer may comprise several arithmetic logic units, a plurality of read only memories, a plurality of random access memories, shift registers, input-output units, etc. From the above, it is obvious that this interconnection technique would be very useful for connecting the subsystems of a computer formed on a single wafer substrate.

Each element on the wafer includes, in addition to the element's primary function, an associative address element and switching circuit for connecting the element to an appropriate data and/or power bus when the associative element receives matching address data. Using this circuitry, each element can be tested individually and then designated as operable or inoperable. Most of the operable elements may then be interconnected to perform a system function. The remaining operable elements are retained as spares. This is opposed to prior art circuits where each element is required to be accessed uniquely by at least one unique element enable line. With prior art circuits, a large number of arrays on the wafer requires a large number of enable lines for array addressing.

A further advantage of this invention results because each device is identified by an alterable associative address. When replacement elements are switched into the system matrix, the associative address of the replaced element may be given to the replacement. No change in address need be reported to the user since, before and after the replacement, the same associative address is used.

Circuit performance and convenience in use is enhanced by implementing the associative elements with metal-nitride-oxide-silicon (MNOS) memory devices. These elements are nonvolatile; the data contained therein are not lost during power shutdown. Furthermore, these elements are electrically programmable so that the replacement of a defective element in an interconnected matrix can be performed automatically in the system.

It is thus an additional object of this invention to provide a circuit which allows the random replacement of defective elements by spare elements on a wafer through the use of a simple electrical process without changing the apparent address of the replaced element and, so, to enable wafer-scale integration. Nonvolatile associative memory elements are used to store the associative address of an element.

DETAILED DESCRIPTION OF THE DRAWINGS

Figure 1:
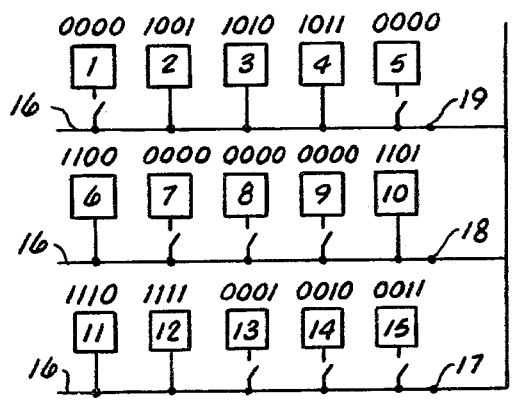
FIG. 1 is a simple block diagram of the matrix of parts interconnected through the use of this inventive apparatus.

The overall operation of this system may be described in relation to FIG. 1 where a plurality of memory elements 1 through 15 are connected to bus 16 which may include but is not restricted to address, data, signal and power lines. As stated above, any electrical functional element can be connected using this associative interconnection technique; a set of memory elements has been chosen in this case as an example.

Let us assume that at the time of manufacture it was determined that elements 1, 5, 7, 8 and 9 were defective, and the rest were usable. Further assume that seven operable elements are required on this wafer. Therefore, this wafer contains three operable spare elements, 13, 14 and 15 which are assigned addresses identifying them as spare elements.

The first step in interconnection of elements on this wafer involves the process of assigning associative memory addresses to the seven selected memory elements. These assigned addresses are 1001 through 1111 of FIG. 1. When the associative decoder of a memory element matches its address with the address in bus 16, data may pass between the selected element and the data line in bus 16. Whenever the user, which in this case can be assumed to be a computer, requests data from location 1001, for instance, memory element 2 will be accessed.

At some later time it may develop that element 2 becomes defective. In this case, address 1001 can be assigned to element 13 and the address 0000 can be assigned to element 2. The address 0000 is an address not used by the system; element 2 now shares this address with inoperative elements 1, 5, 7, 8 and 9. There are two results of this change. First, a replacement element has been provided for a defective element and second, the change of elements has been transparent to the using computer since both before and after the change of the address of the operable element remains the same, 1001. Thus, the user need not keep track of which elements are defective, and no reprogramming is necessary.

The advantage of this invention can be further exemplified in evaluating this technique against prior art redundancy approaches for high reliability systems. One technique utilizes dual-redundant networks, with two identical operating sets of devices. When a control element senses a failure or error in one network, it immediately accepts only the output of the other. When the network is composed of uniquely different elements, the inventive technique of replacement of erring elements by spare elements through the associative interconnect achieves equivalent reliability with approximately half the operating power since the spare element need not be powered until it is used. When, as in the case of memory systems, all elements in each network are equivalent, this invention achieves a lower system failure rate with a lower component count and with lower power than the prior-art dual redundant network. This result is obtained because a minimal number of spares are needed instead of the one-for-one duplication used in dual redundant networks.

Another prior-art technique employs three or more redundant networks and a voting logic capability. In this method the logic circuit polls the redundant networks and delivers a majority opinion. This prior-art technique requires triple the number of operating components and at least triple the power requirement.

It is most convenient for the associative address switching decoder to employ, at least in part, nonvolatile, electrically alterable storage devices. Here, it is assumed that this storage means is implemented by MNOS devices.

The use of switchable gate structures to allow passage of data to operable elements may be broadened to include the switching in and out of sections of the bus for circuit reconfiguration. Points 17, 18 and 19 are example locations for three additional sets of associative switching elements to connect or disconnect parts of the bus. Thus, for example, if the bus to the left of point 17, or any other switch thereon, was defective, point 17 on the bus could be opened, thereby isolating that bus section from the remainder of the bus. An example of the use of this technique would be where five operable chips were required on the wafer. The computer could select any two buses that collectively contain five or more operable devices and allow the disconnection of the remaining sections of the bus.

This technique may be used with circuit elements, for example, CCD memories and transistor shift registers, that are coupled in series as well as those that are coupled in parallel.

Figure 2:
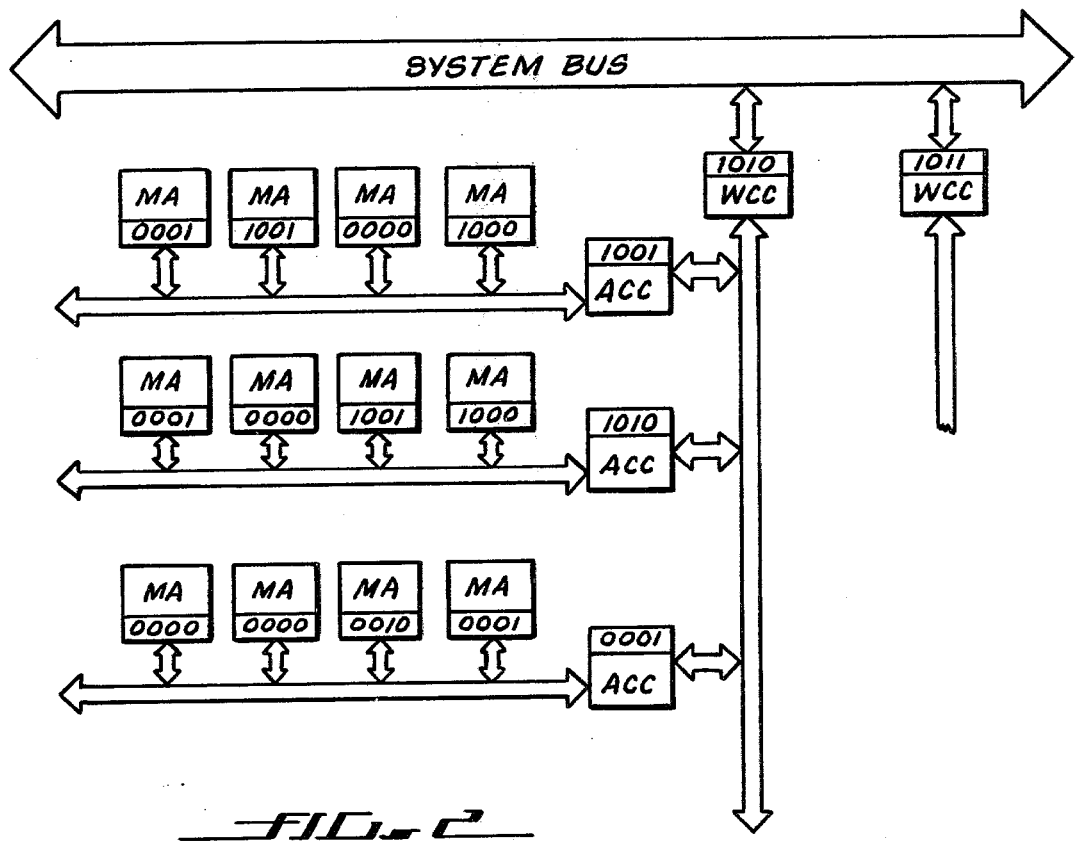
FIG. 2 is a more detailed diagram illustrating organization of a memory wafer module.
Figure 3:
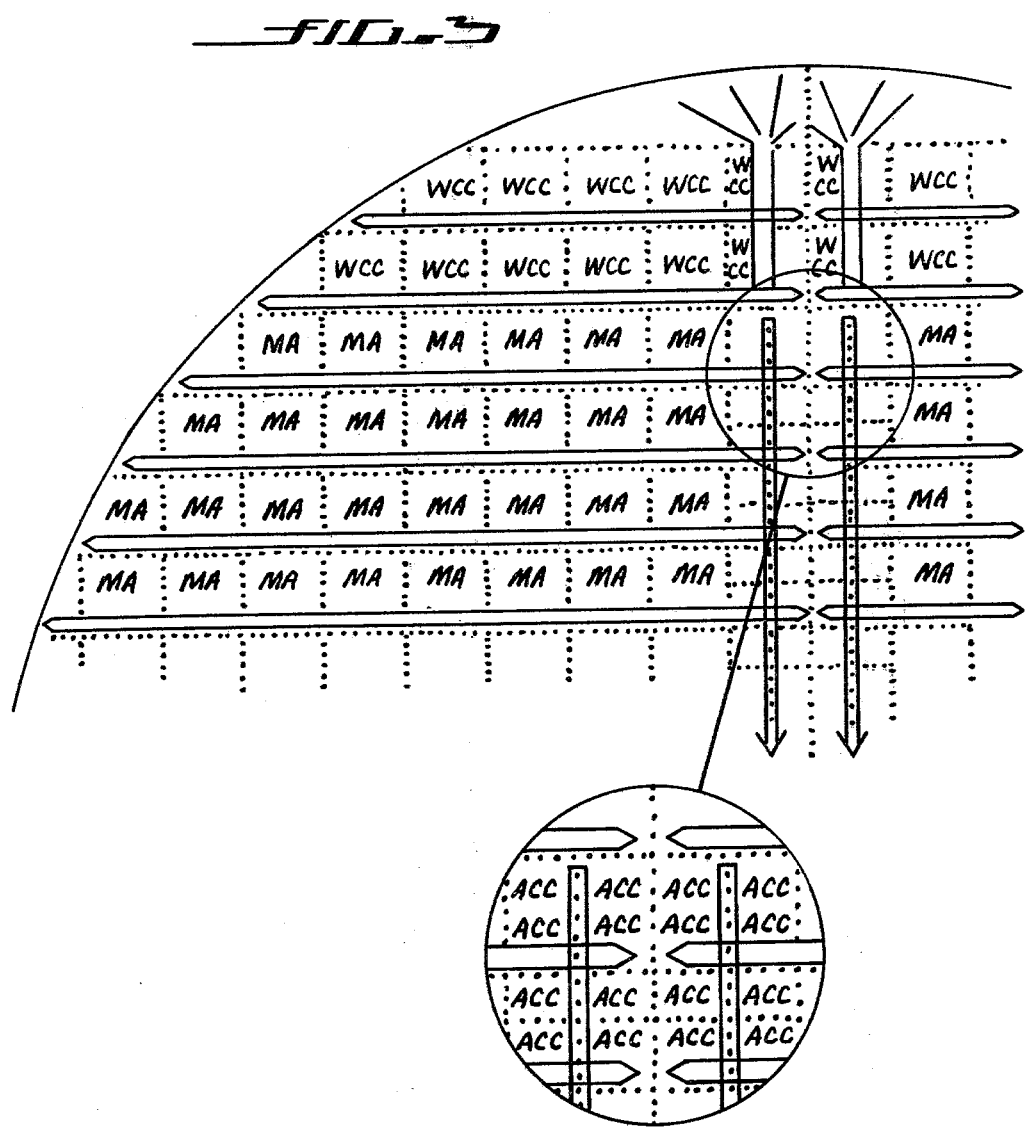
FIG. 3 is a mass memory wafer interconnect organization illustrating the replication of memory array (MA), array channel controller (ACC), and wafer channel controller (WCC) circuits in a wafer.

FIG. 2 illustrates the organization of serial memory arrays to form a memory channel. Several memory channels may be fabricated in the same wafer to produce a memory-wafer module. Three different types of circuit are represented in FIG. 2: memory arrays, MA; array channel controller circuits, ACC; and the wafer channel controller circuits, WCC. The physical location of these circuit types on the wafer is illustrated in FIG. 3, as an example.

To initialize the system, during wafer probe, the wafer channel controller circuits are tested. Addresses are then assigned to all functioning circuits: For each wafer channel, the associative decoder of a wafer channel controller circuit is assigned an operating address. The other functioning wafer channel controller circuits are assigned addresses used for sparing purposes. The remaining non-functioning circuits are assigned disallowed addresses for disconnection of the circuits from the system bus. Similarly, the array channel controller circuits and the memory array circuits are initialized. In addition, a look-up table can be set up, for example, in the wafer channel controller circuit to contain assigned spared addresses for array controller circuits as well as memory array circuits.

Reference can be made on FIG. 2 to exemplify the operation of a memory wafer module. A 12-bit address word is composed of three word segments, each of 4 bits: wafer channel address, array channel address, and array address. Within each address segment the most significant bit designates the status of the addressed circuit. "1" designates a connected operating address; "0" designates a spare address, or is simply the most significant bit of the disallowed address for disconnect. As it is illustrated in the figure, the wafer channel address is 1010, the two connected operating array channels are 1001 and 1010 with a spare channel, 0001. In the array channel, 1001, there are two operating arrays, 1000 and 1001, one spared array, 0001, and an inoperative disconnected array, 0000. The address word 101010011000 accesses array 1000 in array channel 1001 and wafer channel 1010.

At some time, it may be determined that, for example, the array represented by the address 101010011000 needs to be disconnected and a spare connected in its place. The address 10011000 is stored in the wafer channel controller circuit, 1010, and is then applied to the wafer channel bus. The array channel controller, 1001, is accessed; the associative decoder of the erring array identifies that it is being accessed. An instruction signal for reconfiguration applied to the wafer channel controller circuit activates various control signals which result in writing into the accessed associative decoder an address which disconnects the array from the bus controlled by the array channel controller circuit 1001. The disconnect address 0000 is used in this example. By interrogating the spare-address look-up table, the address of the available spare is identified in this example, 0001. The spare address counter is advanced; if the spare address look-up table is interrogated at a later time, it will not identify the same spare array. The spare address is applied to the wafer channel bus, and the spare array is accessed. The address of the previously disconnected array, 1000, temporarily stored in the wafer channel controller circuit, 1010, is then copied into the memory of the associative decoder of the accessed array. Thus the system has completed a self-repairing operation without resorting to the generation of a new address. The address of the replaced array is now assigned to a spare array. The self-repairing or reconfiguration of the wafer memory does not require address changes in the system software or application programs.

The properties of this apparatus may be summarized as follows:
(1) Every element has a reconfiguration address. Therefore, any element can be substituted for any other by a reconfiguration control unit to provide a random sparing capability.
(2) Each associative address is nonvolatile and electrically alterable so that it will not be lost when power is turned off. Yet each address can be changed if necessary or desired.
(3) The user can have random access to all on-line elements since all elements may be coupled in parallel to the address and data lines.
(4) Bus sections as well as functional elements can be coupled and uncoupled. The wafer can be used even if it contains either a defective bus section or a defective switching element.
(5) Each functional element may be disabled in the event the associative address memory is defective.
(6) Power to the functional elements is also coupled through the switch so that spare and defective elements do not use power.

Figure 4:
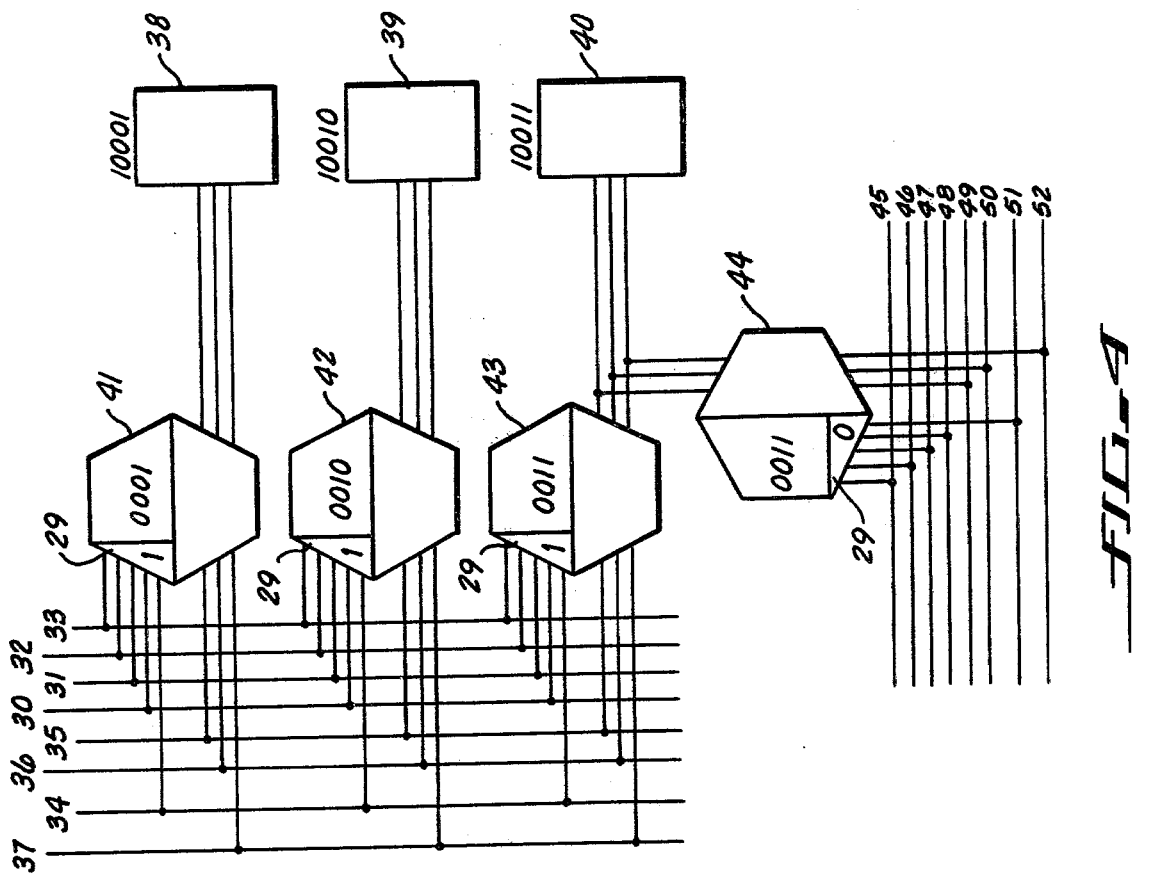
FIG. 4 is a symbolic logic diagram illustrating interrelationships between interconnect buses, associative interconnect, and the functional elements to be connected.

FIG. 4 is a more detailed block diagram showing how the associative interconnect can be used to connect a bus, lines 30 through 37, with functional elements 38 through 40. In this case, three associative decoders 41, 42 and 43, with stored associative addresses 10001, 10010, and 10011 connect the functional elements to the bus. The most significant bit of the stored address is represented here as element 29. Lines 30, 31, 32, 33 and 34 are address lines in the bus. Line 34 is the most significant address bit which identifies the address as an operating address in a spared address format. Lines 35, 36 and 37 represent data, control signal or power lines in the bus that may be switched through a gating structure, which is represented symbolically as the bottom half of each hexagonal element, to the functional elements. On the receipt of the appropriate associative address, lines 35, 36 and 37 are connected to the appropriate functional element 38, 39 and 40. Additionally, these stored addresses are changeable so that a system composed of many functional elements can be reconfigured to obtain, for example, the sparing of defective elements.

FIG. 4 also shows an implementation where a functional element 40 may be connected to either one or two orthogonal bus lines. In this case, dependent on the status of stored data bit 29, associative decoders 43 and 44 couple functional element 40 to either a vertical or a horizontal bus where the horizontal bus lines 45 through 52 are equivalent to the vertical bus lines 30 through 37. A full diagram of this system would show a vertical and horizontal bus matrix for servicing rows and columns of functional elements. This drawing has been simplified to show only the horizontal and vertical connections of a single functional element.

Figure 5:
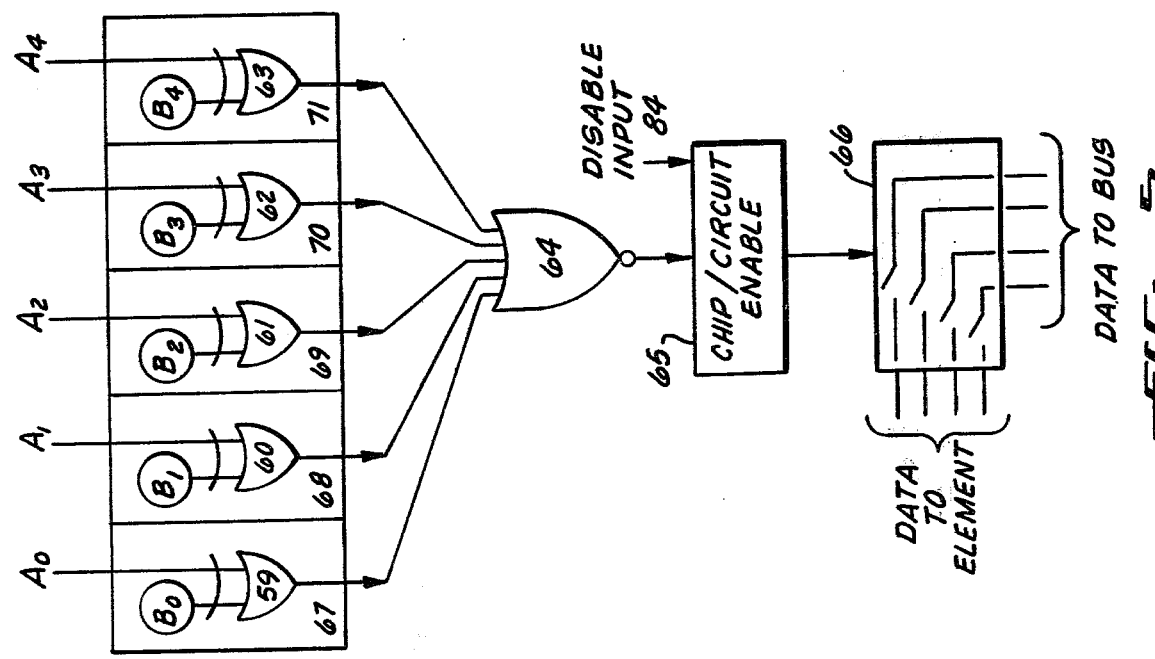
FIG. 5 is a block diagram of one associative interconnect circuit.

FIG. 5 is a schematic representation of the circuit implementation within any one of the hexagonal elements of FIGS. 4, 41 through 44. The $A_0$, $A_1$ $A_2$ $A_3$ and $A_4$ lines couple in the instant associative address while the $B_0$, $B_1$, $B_2$, $B_3$ and $B_4$ stored data are the internally stored associative address of a particular element. When there is complete agreement between ($A_0$, $A_1$, $A_2$, $A_3$, $A_4$) and ($B_0$, $B_1$, $B_2$, $B_3$, $B_4$), which is to say when the memory element has been correctly addressed, the outputs of each exclusive OR gate 59 through 63 will be low, resulting in a high output from the NOR gate 64. This in turn drives an element enable circuit 65 to connect the flow of data, for example, between the element and the data bus lines through a connecting gate 66. Thus, when binary address information applied to $A_0$ through $A_4$ matches $B_0$ through $B_4$, the selected functional element will be connected to the data bus lines.

It is noted here that the most significant bit $B_0$ designates the status of the array. The corresponding address bit $A_0$ identifies access to an operating element, a spare element, or a disconnected element with the invalid address 00000. An additional disabling input 84 can be used to disable the element in the event of a malfunction in the addressing circuit. This input is particularly useful for isolating individual wafer-scale-integrated functional elements for initial wafer probe testing.

Figure 6:
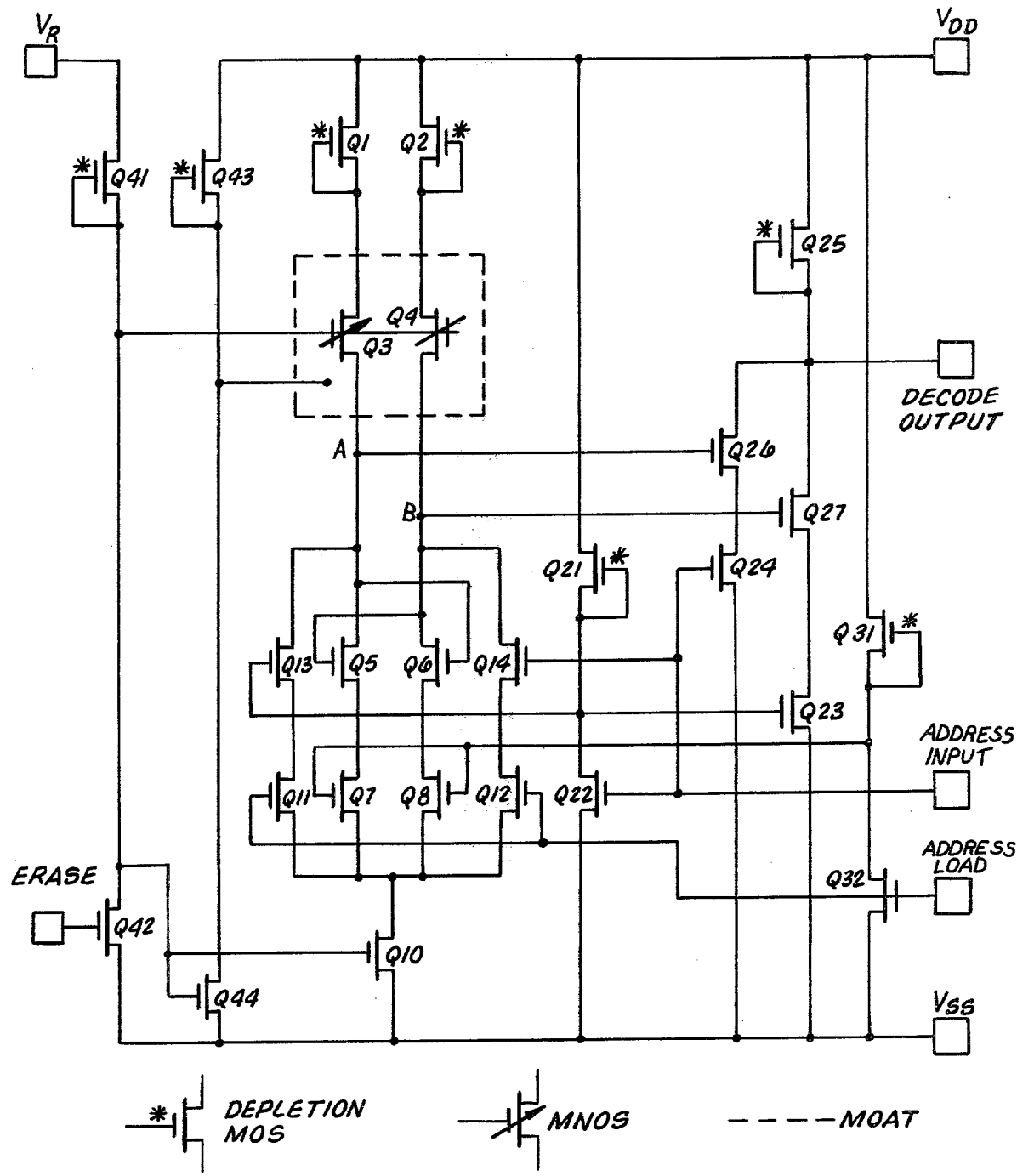
FIG. 6 is a schematic diagram of one bit of the associative memory element of FIG. 5.

A detailed schematic of one embodiment of the circuit of each associative memory bit shown as rectangular circuit blocks 67 through 71 of FIG. 5 is shown in FIG. 6. This particular associative address decode circuit uses depletion load n-channel MOS transistor circuit technology. Transistors Q41, Q43, Q1, Q2, Q21, Q31 and Q25 are depletion load transistors and are used as current sourcing loads for the elements in series with them. The dotted line around transistors Q3 and Q4 is a moat so that the Q3 and Q4 substrate is electrically isolated from the remainder of the circuit substrate. Q3 and Q4 are electrically alterable nonvolatile MNOS memory devices and are used to store one associative address bit of information such as that labelled $B_1$ in device 68 of FIG. 5. Assuming the conditions where "true" or "1" is a positive voltage and "false" or "0" is a zero voltage equaling the voltage at the ground point, $V_{SS}$, the operation of the circuit is described as follows:

The basic transistor groupings that form the memory circuit are Q1 through Q14. Q1 and Q2 are depletion-loaded transistors. Q1 is tied to Q3, Q2 is tied to Q4, and Q3 and Q4 are the MNOS transistors that provide the memory storage of the single-bit address in this circuit. Q5 and Q6 form the basic latch sense circuit. Q7 and Q8 provide the control with which the latch is either connected or disconnected for data entry. Q11 and Q12 enable the address data input to be written into the appropriate nodes A and B through the transistors Q13 and Q14. The transistor grouping Q25, Q26, Q27, Q23 and Q24 is the basic exclusive OR circuit. When the latch is interrogated, that is, when Q3 and Q4 are read, A and B will be set through the latch depending on the state of Q3 and Q4. That information or the voltage in node A and node B is compared against the address information which is AND'ed with the ADDRESS INPUT node tied to the gate of Q24; the inverse of the address data is set by the inverter circuit Q21, Q22, and is tied to the gate of Q23 which is AND'ed with the voltage from B. Q31 and Q32 constitute the ADDRESS LOAD input inverter. Q41 and Q42 comprise the word line driver circuit, which gates the $V_R$ voltages (either at read or at write voltage) to Q3 and Q4 during read or write. Q43 and Q44 make up the memory transistor substrate driver. To erase, Q42 is set to $V_{SS}$ via the ERASE signal, Q10 disconnects the memory circuit, Q44 is turned off and Q43 pulls the substrate of Q3 and Q4 to the erase voltage.

To clear or erase the data stored in Q3 or Q4, the following procedure is required. The voltage $V_R$ is set to equal the voltage $V_{DD}$ or, alternatively, may be set to a voltage approximately equal to $\frac{1}{3} V_{DD}$. The ADDRESS INPUT and ADDRESS LOAD are ignored during this operation. Under these conditions the ERASE input, which is high, is felt at the gate of Q42, which results in a low at the gate of Q44, and the substrate of Q3 and Q4 is driven to $V_{DD}$. Simultaneously, the gates of Q3 and Q4 are driven to $V_{SS}$. Thus, the data contained within MNOS transistors Q3 and Q4 are erased.

To write new data into Q3 and Q4, which for example corresponds to writing a new bit of address information into $B_1$ of element 68 in FIG. 5, the ERASE input is set to equal $V_{SS}$ and the $V_R$ input is set to equal $V_{DD}$. The ADDRESS INPUT is set to the desired bit status which could be either a 1 or a 0 and the ADDRESS LOAD is set to a 1. Under these conditions Q32. Q11 and Q12 will be turned on. Likewise, the drain voltage of Q32, which is set low by the 1 state of ADDRESS LOAD, is coupled to Q7 and Q8, turning them off. Q5 and Q6 are opened or disabled so that the address information is controlled by Q13 and Q14. Assuming an ADDRESS INPUT of 1, a 1 will be felt directly at the gate of Q14 while a 0 will be felt at the gate of Q13 through inverting transistor Q22. At this point since Q12 and Q14 are on, the voltage at point B approximates $V_{SS}$ while transistor Q13 is off, allowing point A to float. Simultaneously, as the ADDRESS LOAD signal completes the gating of the ADDRESS INPUT data information to nodes A and B, $V_{DD}$ voltage is routed to the gates of MNOS memory transistors Q3, Q4. Since ERASE status is set at 0, through the ERASE driver Q43, Q44, the substrate of both Q3 and Q4 is at $V_{SS}$ level. Since node A is floated by Q13, it is pulled toward $V_{DD}$ by Q3. Given the writing voltage at the gate of Q3, the MNOS transistor is in the inhibit write condition; Q4, with its source pulled to $V_{SS}$ via Q14 and Q12 is in the write 1 condition. Hence, with a 1 state ADDRESS INPUT, after the write operation the threshold of Q3 is set at a 0 state (or high conductance state) and Q4 at 1 state (or low conductance state). As it is indicated in Table 2, had the ADDRESS INPUT state been set at 0, the written in threshold status of Q3 and Q4 would be reversed.

To read out the information stored in transistors Q3 and Q4 the ERASE input is set to $V_{SS}$, $V_R$ can be set to one third $V_{DD}$ and the ADDRESS LOAD input is held at $V_{SS}$. Under these conditions, the ADDRESS INPUT, let us assume a 1, is felt through the gate of Q14 and a "0" which has been inverted through Q22 is felt at the gate of Q13. The ADDRESS INPUT also goes to the gate of Q24 and, inverted by Q22, to the gate of Q23. Simultaneously, the voltage at the drain of Q42, which in this case is a voltage approximating $V_R$, is applied to the gates of both memory transistors Q3 and Q4. Let us assume that as a result of a previous load step Q4 is at low conductance state and Q3 is at high conductance state. Then point A will be pulled towards $V_{DD}$ latcing Q5 and Q6 into a condition where Q6 will be in an "on" state and Q5 will be in an "off" state. In other words, the drain of Q5 will be at a high voltage and the train of Q6 will be at a low voltage. Under these conditions, Q26 will receive a 1 at its gate while Q27 will receive a 0. It may be noted that Q25 is being used as a current source where there are two possible paths to ground; one through transistors 24 and 26, the other through transistors 23 and 27. The voltage at the bottom of Q25, which corresponds to the DECODE OUTPUT, will be low if either of the following paths are coupled to ground: one path through Q24 and Q26, the other path through Q23 and Q27. In this case, transistors Q24 and Q26 are both in conducting states since Q24 is receiving a 1 input from the ADDRESS INPUT while Q26 is receiving a 1 or high input from point A. Hence, there is agreement between the ADDRESS INPUT and the stored data; both Q24 and Q26 conduct, supplying a low ouput to the DECODE OUTPUT pin. Thus, if the ADDRESS INPUT is a 1 and point A is high, Q24 and Q26 conduct, resulting in a low output while, if the ADDRESS INPUT is low and the point A voltage is low, Q23 and Q27 will conduct in a similar manner, again supplying a low DECODE OUTPUT. Therefore, the DECODE OUTPUT will be low provided that the ADDRESS INPUT agrees with the data stored in transistors Q3 and Q4, or conversely, if the stored datum in transistor Q3 and Q4 does not correspond to the ADDRESS INPUT state, the DECODE OUTPUT will be high, as shown in Table 1.

The operation of this circuit, which is shown in FIG. 6, is summarized as shown in Tables 1 through 3.

While an exemplary embodiment of this invention has been described above and shown in the accompanying drawings, it is to be understood that such embodiment is merely illustrative of, and not restrictive on, the broad invention and that this invention is not to be limited to the specific construction or arrangement described and shown, for various obvious modifications may occur to persons having ordinary skill in the art.

TABLE 1

SUMMARY OF READ OPERATIONS

| STORED DATUM | Threshold State $Q_3$ | Threshold State $Q_4$ | $V_T$ Driven only Node Condition A | $V_T$ Driven only Node Condition B | ADDRESS INPUT | DECODE OUTPUT |
|---|---|---|---|---|---|---|
| 1 | 0 | 1 | $V_{DD}$ | $V_{SS}$ | 1 | 0 |
| 1 | 0 | 1 | $V_{DD}$ | $V_{SS}$ | 0 | 1 |
| 0 | 1 | 0 | $V_{SS}$ | $V_{DD}$ | 1 | 1 |
| 0 | 1 | 0 | $V_{SS}$ | $V_{DD}$ | 0 | 0 |

OTHER CONDITIONS:
ERASE: 0 Level
ADDRESS LOAD: 0 Level

TABLE 2

SUMMARY OF WRITE OPERATIONS

| INPUT | NODES A | NODES B | Threshold State $Q_3$ | Threshold State $Q_4$ |
|---|---|---|---|---|
| 1 | $V_{DD}$ | $V_{SS}$ | 0 | 1 |
| 0 | $V_{SS}$ | $V_{DD}$ | 1 | 0' |

OTHER CONDITIONS:
ERASE: 0 Level
ADDRESS LOAD: 1 Level

TABLE 3

SUMMARY OF ERASE OPERATIONS
ERASE CONDITIONS:

| ERASE | 1 Level |
|---|---|
| ISOLATED SUBSTRATE | $V_{DD}$ |
| ADDRESS INPUT | DON'T CARE |
| ADDRESS LOAD | DON'T CARE |

What is claimed is:
1. An apparatus comprising:
   a. a plurality of circuit elements,
   b. a bus for carrying signals,
   c. means for selectively coupling at least one of said elements to said bus responsive to a specific, including means for storing an address associated with said element, means for comparing said stored address with said specific signal representing an address on said bus, means for generating an enable signal indicative of the result of comparison, and means for enabling said element to communicate with said bus with responsive to said enable signal when the result of said comparison is the identity of said stored address and said address represented by said specific signal, and
   d. means for controlling said selective coupling means to respond to a selectable specific signal, including
      means for erasing said stored address associated with said element, and
      means for initiating storage of another address in said address storing means, whereby said stored address associated with said element may be altered.

2. An apparatus as described in claim 1 further comprising a means for independently disabling said element, irrespective of the status of any other element whereby other portions of said apparatus responsive to the same signal as said elements may be utilized.

3. An apparatus as described in claim 1 wherein there are a plurality of circuit elements which may be selectively coupled to said bus, each having an alterable stored address operable independently of any other element.

4. An apparatus as described in claim 3 wherein said storing means comprises:
   a. at least one non-volatile memory element for storing a logic state, and
      wherein said erasing means and said initiating means comprises:
   b. a circuit coupled to said memory element for applying electrical potentials which change the state of said memory element.

5. An apparatus as described in claim 4 wherein said means for comparing said stored address and said specific signal address comprises:
   a. means for sensing each address and generating independent state signals for each,
   b. first logic means for generating a compare signal responsive to said state signals, and
   c. second logic means for generating said enable signal responsive to said compare signals.

6. An apparatus as described in claim 5 wherein said first logic means comprises at least one "exclusive or" gate and said second logic means comprises at least one "or" gate.

7. A plural bus structure for carrying signals at least one of which comprises the circuit element described in claim 1 and at least one other such bus comprises the bus described in claim 1.

8. The bus structure described in claim 7 wherein there is at least one other circuit element selectively coupleable to said circuit element bus.

9. The apparatus as described in claim 4 wherein said memory element is an MNOS device and said apparatus is implemented in an integrated circuit structure on a single substrate.

10. An apparatus as described in claim 2 wherein there are a plurality of circuit elements which may be selectively coupled to said bus, each having an alterable stored address operable independently of any other element.

* * * * *